United States Patent
Akahori et al.

(10) Patent No.: US 7,338,751 B2
(45) Date of Patent: Mar. 4, 2008

(54) PROCESS FOR PRODUCING PRINTED WIRING BOARD AND PHOTOSENSITIVE RESIN COMPOSITION USED IN THE SAME

(75) Inventors: Toshihiko Akahori, Hitachi (JP); Ken Sawabe, Hitachi (JP); Michiko Natori, Hitachi (JP); Tomoaki Aoki, Hitachi (JP); Takuya Kajiwara, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/473,466

(22) PCT Filed: Mar. 29, 2002

(86) PCT No.: PCT/JP02/03147

§ 371 (c)(1),
(2), (4) Date: Sep. 29, 2003

(87) PCT Pub. No.: WO02/079877

PCT Pub. Date: Oct. 10, 2002

(65) Prior Publication Data

US 2004/0086801 A1    May 6, 2004

(30) Foreign Application Priority Data

Mar. 29, 2001 (JP) ............................. 2001-096367

(51) Int. Cl.
*G03F 7/20* (2006.01)
*G03F 7/30* (2006.01)
*G03F 7/42* (2006.01)
*G03F 7/26* (2006.01)
*G03F 7/032* (2006.01)

(52) U.S. Cl. ............... 430/315; 430/311; 430/313; 430/319; 430/329; 430/324; 430/325; 430/326; 430/330; 430/270.1; 430/281.1; 430/285.1; 430/280.1; 430/284.1

(58) Field of Classification Search ............... 430/311, 430/313, 314, 315, 325, 328, 329, 330, 285.1
See application file for complete search history.

(56) References Cited

U.S. PATENT DOCUMENTS

| | | | |
|---|---|---|---|
| 4,543,318 A * | 9/1985 | Maeda et al. ............ | 430/288.1 |
| 5,922,509 A | 7/1999 | Kautz et al. | |
| 5,935,761 A * | 8/1999 | Hwang et al. ............ | 430/281.1 |
| 6,703,181 B1 * | 3/2004 | Hayashi et al. ............ | 430/270.1 |

FOREIGN PATENT DOCUMENTS

EP    0 623 852 A1    11/1994

(Continued)

OTHER PUBLICATIONS

Machine-assisted English translation of JP 10-051107, provided by JPO.*

(Continued)

*Primary Examiner*—Sin Lee
(74) *Attorney, Agent, or Firm*—Griffin & Szipl, P.C.

(57) ABSTRACT

An object of the present invention is to provide a process for producing a printed wiring board, which is advantageous not only in that the reduction in size and increase in density of the wiring board are achieved and further the steps are simplified, but also in that the connection reliability of mount parts and the yield are improved, and a photosensitive resin composition used in the process. The present invention is directed to a process for producing a printed wiring board, comprising the steps of: (i) forming a solder resist on a wiring board having a circuit; (ii) laminating a preliminarily molded layer of a photosensitive resin composition on the solder resist; (iii) subjecting the layer of the photosensitive resin composition to exposure and development to form a resist pattern of the photosensitive resin composition; (iv) subjecting the entire surface of the resultant board to electroless plating, and (v) stripping the layer of the photosensitive resin composition, wherein the steps are conducted in this order, as well as a photosensitive resin composition and the layer thereof used in the process.

33 Claims, 2 Drawing Sheets

FOREIGN PATENT DOCUMENTS

| | | | |
|---|---|---|---|
| EP | 0 916 480 A1 | | 5/1999 |
| EP | 1 076 262 A1 | | 2/2001 |
| JP | 06-282069 | | 10/1994 |
| JP | 6-282069 | * | 10/1994 |
| JP | 06-317904 A | | 11/1994 |
| JP | 09-265188 | | 10/1997 |
| JP | 9-265188 | * | 10/1997 |
| JP | 10-051107 | | 2/1998 |
| JP | 10-128897 A | | 5/1998 |
| JP | 11-284336 | | 10/1999 |
| JP | 11-327137 A2 | | 11/1999 |
| JP | 2000-275831 | | 10/2000 |
| JP | 2001-048982 A | | 2/2001 |

OTHER PUBLICATIONS

Machine-assisted English translation of JP 9-265188, provided by JPO.*

Machine-assisted English translation of JP 6-282069, provided by JPO.*

International Search Report, PCT/JP02/03147, Japanese Patent Office, Jun. 18, 2002, 4 pages.

English Language Translation of International Preliminary Examination Report for corresponding international application, completed Feb. 10, 2003.

Patent Abstracts of Japan, English Abstract of JP 11-327137, published Nov. 26, 1999.

Office Action issued in the corresponding Japanese Application No. 2002-577648 on Mar. 13, 2007.

* cited by examiner

PROCESS FOR PRODUCING PRINTED WIRING BOARD AND PHOTOSENSITIVE RESIN COMPOSITION USED IN THE SAME

This is a National Phase Application in the United States of International Patent Application No. PCT/JP02/03147 filed Mar. 29, 2002, which claims priority on Japanese Patent Application No. 2001-096367, filed Mar. 29, 2001. The entire disclosures of the above patent applications are hereby incorporated by reference.

FIELD OF THE INVENTION

The present invention relates to a process for producing a printed wiring board and a photosensitive resin composition used in the same. More particularly, the present invention is concerned with a process for producing a printed wiring board, which can simplify the steps and improve the connection reliability of mount parts and the yield, and a photosensitive resin composition used in the process.

BACKGROUND ART

Conventionally, in the field of printed wiring board fabrication, for protecting the circuits and lowering the contact resistance and the like, the circuits are processed by metal plating. Further, as portable electronic appliances are spreading, mount parts used in the form of a chip scale package (hereinafter, referred to simply as "CSP") or ball grid array (hereinafter, referred to simply as "BGA") advantageous to the reduction in size are rapidly increasing. In such mount parts, a resist is formed on the entire surface of the circuit conductor on the wiring board having circuits, excluding mount pads (solder pads) and the like, and the exposed pad portions and the like are processed by metal plating. Then, the mount parts and the pads processed by metal plating are joined together by a solder ball, and the wiring board having circuits is connected to another wiring board having circuits or another part. In the metal plating processing, for securing excellent metallic bond, gold plating is usually used. Gold plating is expensive and such soft that the Mohs hardness is 2.5.

In accordance with a trend towards reduction in size and increase in density of printed wiring boards as well as application of the metal plating technique to the surface mount of electronic parts, the mainstream of the metal plating is being changed from electrolytic plating to electroless plating for the reason that the electroless plating needs no lead wire for electrodes and offers a uniform plating thickness and a flat surface and the like, and this change is rapidly progressing especially in substrates for use in portable electronic appliances. However, we have found that the printed wiring board formed by an electroless plating method has a problem in that it has poor mechanical strength due to phosphorus contained in the Ni plating layer and has poor yield of the jointing and hence, it has low solder ball connection reliability, as compared to the wiring board formed by the conventional electrolytic plating. In addition, we have found problems not only in that the solder ball connection reliability is low, but also in that the steps are increased to cause the process to be complicated.

Further, recently, in the substrate for use in portable electronic appliances, a problem arises that the substrate suffers bending or deflection due to drop impact or force caused by pressing an input key and thus mount parts, such as CSP and BGA and the like, are easily removed from the substrate surface. In order to solve this problem, a method using a substrate material which absorbs drop impact and the like and an improvement of the electroless plating method are considered, but an effective method has not yet been found.

It is an object to provide an improved process for producing a printed wiring board free of the above problems, which process is advantageous not only in that surface mount of electronic parts for achieving a reduction in size and an increase in density of the wiring board is realized using novel step procedures for the process and the steps are simplified, but also in that the steps have high yield and the printed wiring board obtained has excellent connection reliability of mount parts, as well as a photosensitive resin composition and a layer thereof having excellent plating resistance and excellent stripping properties, which are advantageously used in such a production process.

DISCLOSURE OF THE INVENTION

The process of the present invention is directed to a process for producing a printed wiring board, the process comprising the steps of:

(i) forming a solder resist on a wiring board having a circuit;

(ii) laminating a preliminarily molded layer of a photosensitive resin composition on the solder resist;

(iii) subjecting the layer of the photosensitive resin composition to exposure and development to form a resist pattern of the photosensitive resin composition;

(iv) subjecting the entire surface of the resultant board to electroless plating; and (v) stripping the layer of the photosensitive resin composition.

The present invention is directed to a photosensitive resin composition for use in printed wiring board production as a plating resist for two or more different types of electroless plating, wherein a total molar number ΣM of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} M i N i \quad (I)$$

where ΣM is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number ΣM of reactive groups in the photopolymerizable compound having in the molecule thereof a polymerizable, unsaturated ethylene group contained in the photosensitive resin composition is 0.3 to 1.5 mol per 1 kg of a solid component of the photosensitive resin composition.

Figure 1A:
FIG. 1 is a flow diagram of one example of a process for producing a printed wiring board of the present invention.
Figure 1B:
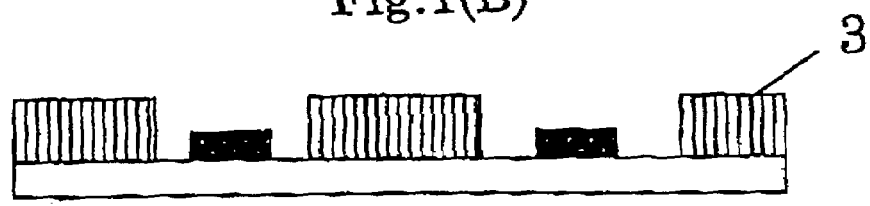
Figure 1C:
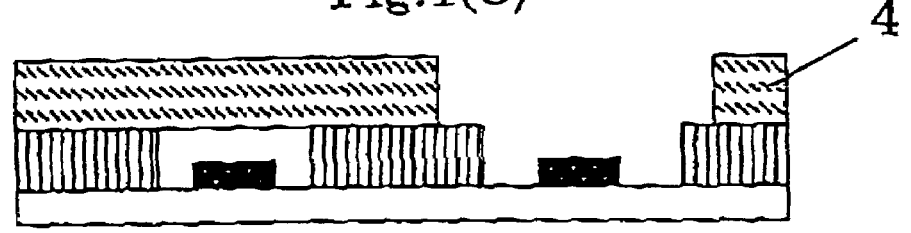
Figure 1D:
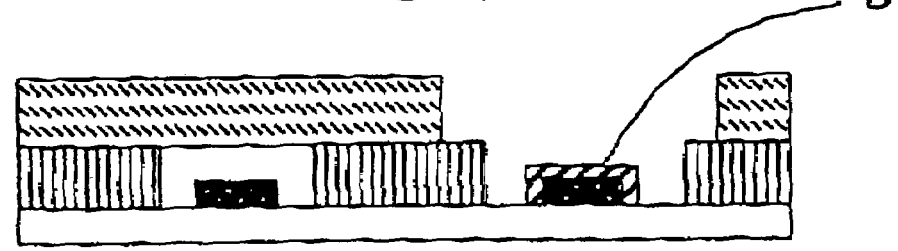
Figure 1E:
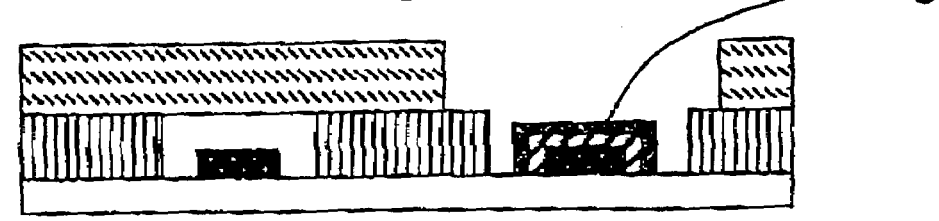
Figure 1F:

The reference numerals in the figure denote the following; 1: substrate; 2: circuit; 3: solder resist; 4: layer of photosensitive resin composition; 4': resist pattern of the layer of photosensitive resin composition; 5: electroless Ni plating; and 6: replacement Au plating.

Figure 2:
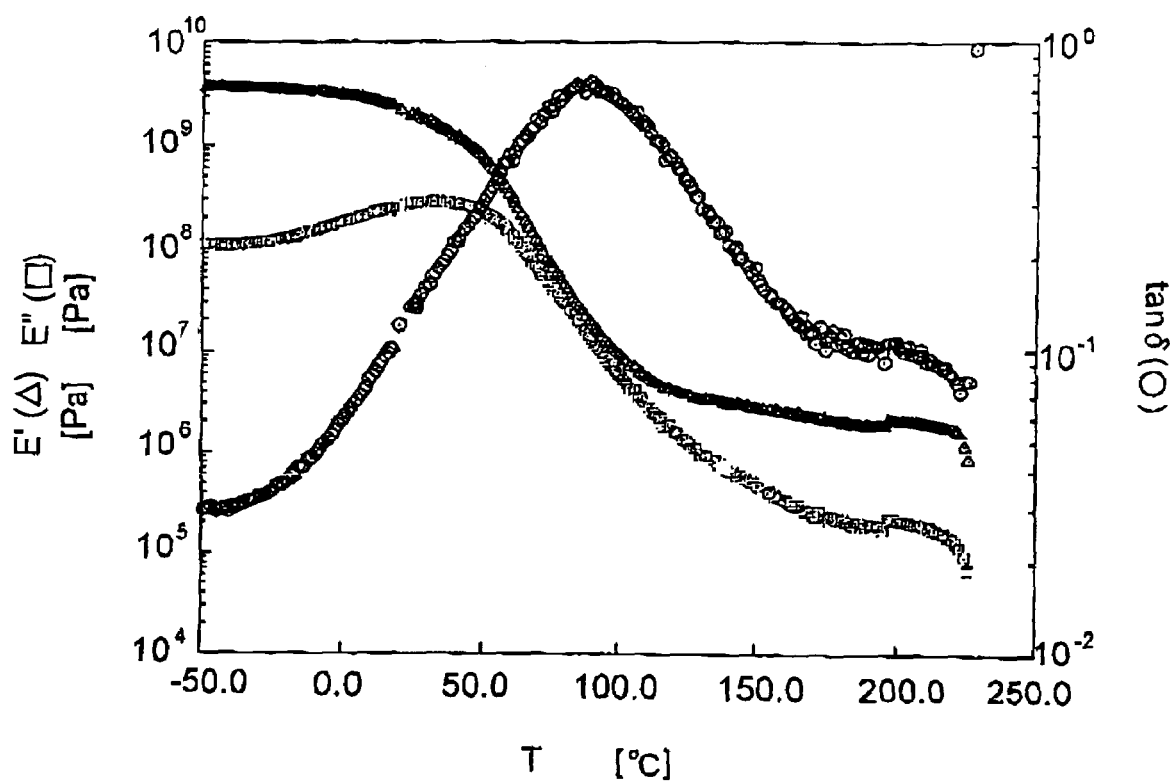

FIG. 2 shows viscoelasticity temperature dispersion curves of a cured product of one example of a photosensitive resin composition of the present invention.

BEST MODE FOR CARRYING OUT THE INVENTION

Hereinbelow, the present invention will be described in detail.

In the present invention, the wiring board having a circuit is a wiring board having a circuit, comprising a substrate and a circuit (circuit conductor wire), and it may have, for example, through holes, and may have a multilayer structure, and it is contained in a printed wiring board.

The resist is a covering material for masking or protecting a specific region of a printed wiring board in order to achieve selective etching, soldering, or film formation, and it serves as a plating protective film. Generally, a photoresist is used, and, utilizing its photosensitivity, a predetermined region is covered with a fine and precise pattern with high accuracy to protect an object to be protected. In the present invention, the resist is classified into two types according to the purpose.

One of them is a solder resist, and it is applied so that, for example, only a region in which a connection portion is formed by soldering is exposed (in other words, excluding mount pads, the entire surface of the wiring board having a circuit is covered), applied and subjected to exposure to form with a desired covering (protecting) pattern.

Another one is a resist used as a plating resist differing from the solder resist, and it is used in the form of a preliminarily molded layer/film of a photosensitive resin composition, and the molded layer/film is subjected to exposure so that only a region to be subjected to electroless plating is exposed (in other words, the entire surface of the wiring board having a circuit, e.g., pad portions in which metal deposition by plating is undesirable is covered) to form a resist pattern of the photosensitive resin composition.

Hereinbelow, one example of the present invention will be described in more detail with reference to the drawings. As shown in FIG. 1, on a substrate having a circuit comprising substrate 1 and circuit 2 (A), solder resist 3 is formed on a region except mount pads (B). Then, on solder resist 3, preliminarily molded layer 4 of a photosensitive resin composition is laminated, and the layer of the photosensitive resin composition is subjected to exposure and development so that only a region to be subjected to electroless plating is exposed (a region or, e.g., pad portions in which metal deposition by plating is undesirable is covered) to form resist pattern 4' of the photosensitive resin composition layer as a plating resist (C). Resist pattern 4' can be optionally postcured later. Using solder resist 3 and resist pattern 4' of the photosensitive resin composition layer as a mask, the entire surface thereof is subjected to electroless plating 5, for example, electroless Ni plating, such as Ni/Au plating, to form a plating coat on the unmasked surface of the circuit (D), and subsequently subjected to replacement Au plating 6 (E) to obtain a plating coat which causes only a desired portion to be metal-plated. Then, resist pattern 4' of the photosensitive resin composition layer as a plating resist is stripped (F) to obtain a printed wiring board having excellent connection reliability of mount parts.

When the step of forming a solder resist {step (i) in the present invention} is conducted before the electroless plating step and others {steps (ii) to (v) in the present invention} as described in the process of the present invention, the layer of the photosensitive resin composition is laminated on the solder resist. In this case, the solder resist itself has excellent light screen properties, and therefore no problem of light leakage occurs.

When the order of the steps different from that in the present invention is used, a change is caused in the circumstances. For example, when the order of the steps in the process is changed so as to reverse the order of the steps of forming a solder resist and of the electroless plating and of others in the present invention, e.g., in a process in which a layer of the photosensitive resin composition is laminated on a substrate having a circuit, and subjected to exposure and development to form a resist pattern, and subjected to electroless Ni/Au plating and the layer of the photosensitive resin composition is stripped {corresponding to steps (ii) to (v) in the present invention}, and then a solder resist is formed {corresponding to step (i) in the present inventions}, the place whereon the layer of the photosensitive resin composition being laminated is a glass epoxy substrate and others.

As mentioned above, when the step of forming a solder resist is conducted after steps of the electroless plating and others, the place whereon the layer of the photosensitive resin composition being laminated is a glass epoxy substrate and others. A glass epoxy substrate has poor light screen properties, and hence a problem arises in that the photosensitive resin composition in a region which should not be exposed is exposed. Specifically, when the upper surface of the substrate is subjected to exposure, the light, which has passed through the layer of the photosensitive resin composition on the top surface of the substrate, passes through the glass epoxy substrate and reaches the layer of the photosensitive resin composition on the bottom surface of the substrate, and a similar phenomenon occurs on the opposite side, so that an unnecessarily cured layer of the photosensitive resin composition is obtained, causing unfavorable outstripped remaining portions in the stripping step after the electroless plating. In addition, a solder resist is formed on a gold-plated surface after electroless gold plating, and therefore development residue of the solder resist is likely to remain on the gold-plated surface, leading to a problem of lowering of the electrical properties.

Therefore, in the process for producing a printed wiring board, the order of the steps is important, and it is necessary that the step of forming a solder resist be before the electroless plating step and others. By virtue of this, a printed wiring board having excellent connection reliability of mount parts can be obtained.

In the present invention, with respect to the material for the solder resist, there is no particular limitation as long as it is a material usable as a resist. For example, when the solder resist is formed using a photoresist, the photoresist is coated to a wiring board having a circuit and predried, and then photopolymerized by selective exposure through a photomask using an active energy ray and developed using a developer to form a resist pattern for solder resist, and then thermoset by heating to form a solder resist. Here, as a method for applying a photoresist onto a substrate to form a paint film, a known method can be used. For example, a coating method, such as a screen printing method, curtain coating, roll coating, or spray coating, can be appropriately selected. And, the solder resist can be obtained by laminating an element which is a photoresist molded on a film (photosensitive element) on a substrate, and subjecting the element to exposure and development. Further, the solder resist can be formed similarly using a non-photosensitive solder resist by, e.g., a screen printing method and the like.

Photosensitive resin composition (A) as a plating resist in the present invention is a photosensitive resin composition for electroless plating resist in the printed wiring board production, and it is preferred that the photosensitive resin composition is laminated on a solder resist formed on a wiring board having a circuit and patterned and then used. With respect to the form or shape of the photosensitive resin composition, there is no particular limitation, but it is preferred that the composition is used as a laminated layer of preliminarily molded on a wiring board having a circuit with a solder resist formed thereon. And, the composition can be used in the form of liquid, and applied and dried, and then optionally covered with a protective film. With respect to the form of the composition preliminarily molded, it is preferred to use the composition in the form of a photosensitive element obtained by, for example, applying the composition onto a support and drying it and optionally covering it with a protective film. The thickness of the (A) layer varies depending on the use of the printed wiring board. For example, it is preferred that the dried layer has a thickness of about 1 to 100 μm. From the viewpoint of achieving excellent plating resistance, it is more preferred that the thickness is 40 to 75 μm. When liquid resin composition (A) is used after drying and then covered with a protective film, as examples of protective films, there can be mentioned polymer films, such as polyethylene and polypropylene.

Photosensitive resin composition (A) of the present invention contains at least one photopolymerizable compound and photopolymerization initiator and optionally a binder polymer. Such a photopolymerizable compound is preferably one having in the molecule thereof a polymerizable, unsaturated ethylene group.

In the present invention, from the viewpoint of obtaining a good balance between the plating resistance and the strip time after the electroless plating, wherein a total molar number ΣM of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} MiNi \qquad (I)$$

where ΣM is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number ΣM of reactive groups in the photopolymerizable compound having in the molecule thereof a polymerizable, unsaturated ethylene group contained in the photosensitive resin composition is preferably 0.3 to 1.5 mol, more preferably 0.4 to 1.3 mol, especially preferably 0.5 to 1.1 mol, per 1 kg of a solid component of the photosensitive resin composition.

As for the photopolymerizable compounds having in the molecule thereof a polymerizable, unsaturated ethylene group used in the above-mentioned photosensitive resin composition (A) include, for example, compounds obtained by reacting a polyhydroxy alcohol with an α,β-unsaturated carboxylic acid; bisphenol A (meth)acrylate compounds, such as 2,2-bis[4-{(meth)acryloxypolyethoxy}phenyl]propane, 2,2-bis[4-{(meth)acryloxypolypropoxy}phenyl]propane, 2,2-bis[4-{(meth)acryloxypolybutoxy}phenyl]propane, and 2,2-bis[4-{(meth)acryloxypolyethoxypolypropoxy}phenyl]propane; compounds obtained by reacting a glycidyl group-containing compound with an α,β-unsaturated carboxylic acid; urethane monomers, such as (meth)acrylate compounds having an urethane bond in the molecule; nonylphenoxy polyethyleneoxy (meth)acrylate; phthalic acid compounds, such as γ-chloro-β-hydroxypropyl-β'-(meth)acryloyloxy-ethyl-o-phthalate and β-hydroxyalkyl-β'-(meth)acryloyloxyalkyl-o-phthalate; alkyl(meth)acrylate ester and the like, and preferred are bisphenol A (meth)acrylate compounds. Especially preferred are bisphenol A polyoxyethylene dimethacrylate, ethylene oxide, polypropylene oxide-modified urethane dimethacrylate, and ethylene oxide-modified trimethylolpropane triacrylate. These can be used in single or in combination of two or more of the above. The molecular weight of the photopolymerizable compound is preferably 1,000 or more, more preferably 1,500 or more, especially preferably 2,000 or more, extremely preferably 2,500 or more. These can be used in single or in combination of two or more of the above.

As for the compounds obtained by reacting the above-mentioned polyhydroxy alcohol with an α,β-unsaturated carboxylic acid include, for example, polyethylene glycol di(meth)acrylate having 2 to 14 ethylene groups, polypropylene glycol di(meth)acrylate having 2 to 14 propylene groups, polyethylene glycol-polypropylene glycol di(meth)acrylate having 2 to 14 ethylene groups and 2 to 14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO, PO-modified trimethylolpropane tri(meth)acrylate, tetramethylolmethane tri(meth)acrylate, tetramethylolmethane tetra(meth)acrylate, dipentaerythritol penta (meth)acrylate, and dipentaerythritol hexa(meth)acrylate. These can be used in single or in combination of two or more of the above.

EO designates ethylene oxide, and the EO-modified compound has a block structure comprised of an ethylene oxide group. Further, PO designates propylene oxide, and the PO-modified compound has a block structure comprised of a propylene oxide group.

As for the above-mentioned 2,2-bis[4-{(meth)acryloxypolyethoxy}phenyl]propane include, for example, 2,2-bis[4-{(meth) acryloxydiethoxy}phenyl]propane, 2,2-bis[4-{(meth)acryloxytriethoxy}phenyl]propane, 2,2-bis[4-{(meth)acryloxytetraethoxyl}phenyl]propane, 2,2-bis[4-{(meth)acryloxypentaethoxy}phenyl]propane, 2,2-bis[4-{(meth)acryloxyhexaethoxy}phenyl]propane, 2,2-bis [4-{(meth)acryloxyheptaethoxy}phenyl]propane, 2, 2-bis [4-{(meth)acryloxyoctaethoxy}phenyl]propane, 2,2-bis[4-{(meth)acryloxynonaethoxy}phenyl]propane, 2,2-bis [4-{(meth)acryloxydecaethoxy}phenyl]propane, 2,2-bis [4-{(meth)acryloxyundecaethoxy}phenyl]propane, 2,2-bis[4-{(meth)acryloxydodecaethoxy}phenyl]propane, 2,2-bis[4-

{(meth)acryloxytridecaethoxy}phenyl]propane, 2,2-bis[4-{(meth)acryloxytetradecaethoxy}phenyl]propane, 2,2-bis[4-{(meth) acryloxypentadecaethoxy}phenyl]propane, and 2,2-bis[4-{(meth)acryloxyhexadecaethoxy}phenyl]propane, and 2,2-bis[4-(methacryloxypentaethoxy)phenyl]propane is commercially available as BPE-500 (trade name; manufactured by Shin-Nakamura Chemical Co., Ltd.), and 2,2-bis[4-(methacryloxypentadecaethoxy)phenyl]propane is commercially available as BPE-1300 (manufactured by Shin-Nakamura Chemical Co., Ltd.). These can be used in single or in combination of two or more of the above. The number of ethoxy groups in the molecule is preferably 14 or more, more preferably 20 or more, especially preferably 25 or more. The number of ethoxy groups in the molecule is preferably 50 or less.

As for the above-mentioned 2,2-bis[4-{(meth) acryloxypolyethoxypolypropoxy}phenyl]propane include, for example, 2,2-bis[4-{(meth) acryloxydiethoxyoctapropoxy}phenyl]propane, 2,2-bis[4-{(meth)acryloxytetraethoxytetrapropoxy}phenyl]propane, and 2,2-bis[4-{(meth) acryloxyhexaethoxyhexapropoxy}phenyl]propane. These can be used in single or in combination of two or more of the above.

As for the above-mentioned (meth)acrylate compounds having an urethane bond in the molecule include, for example, addition reaction products of (a)an (meth)acrylate monomer having a OH group at a β-position with a diisocyanate compound, such as isophorone diisocyanate, 2,6-toluene diisocyanate, 2,4-toluene diisocyanate, or 1,6-hexamethylene diisocyanate; tris{(meth)acryloxytetraethylene glycol isocyanate} hexamethyleneisocyanurate; EO-modified urethane di(meth)acrylate; and EO, PO-modified urethane di(meth)acrylate. As for the EO-modified urethane di(meth)acrylate include, for example, trade name: UA-11, manufactured by Shin-Nakamura Chemical Co, Ltd. As for the EO, PO-modified urethane di(meth)acrylate include, for example, trade name: UA-13, manufactured by Shin-Nakamura Chemical Co., Ltd.

As for the above-mentioned nonylphenoxy polyethyleneoxy (meth)acrylate include, for example, nonylphenoxy tetraethyleneoxy (meth)acrylate, nonylphenoxy pentaethyleneoxy (meth)acrylate, nonylphenoxy hexaethyleneoxy (meth)acrylate, nonylphenoxy heptaethyleneoxy (meth) acrylate, nonylphenoxy octaethyleneoxy (meth)acrylate, nonylphenoxy nonaethyleneoxy (meth)acrylate, nonylphenoxy decaethyleneoxy (meth)acrylate, and nonylphenoxy undecaethyleneoxy (meth)acrylate.

As for the photopolymerization initiators used in photosensitive resin composition (A) include, for example, N,N'-tetraalkyl-4,4'-diaminobenzophenones, such as benzophenone and N,N'-tetramethyl-4,4'-diaminobenzophenone (Michler's ketone); aromatic ketones, such as 2-benzyl-2-dimethylamino-1-(4-morpholinophenyl)-butane-1-one and 2-methyl-1-[4-(methylthio)phenyl]-2-morpholino-propane-1-one; quinones, such as alkylanthraquinone; benzoin ether compounds, such as benzoin alkyl ether; benzoin compounds, such as benzoin and alkylbenzoin; benzyl derivatives, such as benzyl dimethyl ketal; 2,4,5-triarylimidazole dimers, such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; acridine derivatives, such as 9-phenylacridine and 1,7-bis(9,9'-acridinyl) heptane; N-phenylglycine; N-phenylglycine derivatives; and coumarin compounds. The substituents of aryl groups in the two 2,4,5-triarylimidazole may be either the same symmetric compounds or different asymmetric compounds. From the viewpoint of obtaining excellent adhesion and excellent sensitivity, 2,4,5-triarylimidazole dimers are more preferred. These can be used in single or in combination of two or more of the above.

As for the binder polymers used in photosensitive resin composition (A) of the present invention include, for example, acrylic resins, styrene resins, epoxy resins, amide resins, amide epoxy resins, alkyd resins, and phenolic resins. From the viewpoint of achieving excellent alkaline development, acrylic resins are preferred. These can be used in single or in combination of two or sore of the above. In the present invention, the (meth)acrylic acid means acrylic acid and the corresponding methacrylic acid, the (meth)acrylate means acrylate and the corresponding methacrylate, and the (meth)acryloyl group means acryloyl group and the corresponding methacryloyl group. The binder polymer can have a photosensitive group optionally.

The above-mentioned binder polymer can be producted by, for example, radically polymerizing polymerizable monomers. As for the above-mentioned polymerizable monomers include, for example, polymerizable styrene derivatives, such as styrene, vinyltoluene, α-methylstyrene, p-methylstyrene, and p-ethylstyrene; acrylamide; acrylonitrile; vinylalcohol esters, such as vinyl-n-butyl ether; alkyl (meth)acrylate esters; (tetrahydrofurfuryl (meth)acrylate ester; dimethylaminoethyl (meth)acrylate ester; diethylaminoethyl (meth)acrylate ester; glycidyl (meth)acrylate ester; 2,2,2-trifluoroethyl (meth) acrylate; 2,2,3,3-tetrafluoropropyl (meth)acrylate; (meth)acrylic acid; α-bromo(meth)acrylic acid; α-chloro (meth) acrylic acid; β-furyl(meth)acrylic acid; β-styryl(meth)acrylic acid; maleic acid; maleic anhydride; alkyl maleate monoesters, such as monomethyl maleate, monoethyl maleate, and monoisopropyl maleate; fumaric acid; cinnamic acid; α-cyanocinnamic acid; itaconic acid; crotonic acid; and propiolic acid. These can be used in single or in combination of two or more of the above.

As for the above-mentioned alkyl(meth)acrylate esters include, for example, methyl (meth)acrylate, ethyl (meth) acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, and structural isomers thereof. These can be used in single or in combination of two or more of the above.

From the viewpoint of achieving excellent alkaline development properties, it is preferred that the above-mentioned binder polymer contains a carboxyl group, and, for example, it can be prepared by radically polymerizing polymerizable monomers having a carboxyl group and another polymerizable monomers. As for the above-mentioned polymerizable monomer having a carboxyl group, methacrylic acid is preferred. Further, from the viewpoint of obtaining a film having excellent physical properties, it is preferred that the binder polymer contains styrene or a styrene derivative as a polymerizable monomer.

For achieving both excellent adhesion and excellent stripping properties, the above-mentioned binder polymer preferably contains styrene or a styrene derivative as a copolymer component in an amount of 3 to 30% by weight, more preferably 4 to 28% by weight, especially 5 to 27% by weight.

For achieving both short development time and excellent developer resistance, the above-mentioned binder polymer component preferably has an acid value of 30 to 200 mg KOH/g, more preferably 45 to 150 mg KOH/g. When solvent development is conducted in the development step, it is preferred that the binder polymer is prepared so as to have a smaller amount of the polymerizable monomer having a carboxyl group.

For achieving both short development time and excellent developer resistance, the above-mentioned binder polymer component preferably has a weight average molecular weight (as measured by gel permeation chromatography (GPC) and determined using a calibration curve obtained from standard polystyrene) of 20,000 to 300,000, more preferably 25,000 to 150,000. The binder polymer can have a photosensitive group optionally.

These binder polymers can be used in single or in combination of two or more of the above. As for the combinations of above-mentioned binder polymers used, there can be mentioned, for example, two or more types of binder polymers comprised of different copolymer components, two or more types of binder polymers having different weight average molecular weights, and two or more types of binder polymers having different degrees of dispersion. The polymer having multi-mode molecular weight distribution described in Japanese Provisional Patent Publication No. 327137/1999 can be used.

Photosensitive resin composition (A) of the present invention can be optionally applied in the form of a solution having a solid component of about 30 to 60% by weight in a solution, such as methanol, ethanol, acetone, methyl ethyl ketone, ethylene glycol monomethyl ether, ethylene glycol monoethyl ether, toluene, N,N-dimethylformamide, or propylene glycol monomethyl ether, or a mixed solvent thereof.

In photosensitive resin composition (A) of the present invention, a photopolymerizable compound having in the molecule thereof at least one cationically polymerizable cyclic ether group (e.g., an oxetane compound), a cationic polymerization initiator, a dye, such as malachite green, a photo-coloring agent, such as tribromomethylphenyl sulfone or leuco crystal violet, a thermo-coloring prevention agent, a plasticizer, such as p-toluenesulfonamide, a pigment, filler, a defoamer, a flame retardant, a stabilizer, a leveling agent, a strip promoter, an antioxidant, a perfume, an imaging agent, or a thermally crosslinking agent can be optionally added. These can be used in single or in combination of two or more of the above.

It is preferred that an adhesion improving agent, such as benzotriazole or a derivative thereof, benzimidazole or a derivative thereof, or benzothiazole or a derivative thereof, is not added to the photosensitive resin composition. The reason for this is as follows. When electroless plating is conducted using, as a plating resist, the layer of the photosensitive resin composition containing an adhesion improving agent, the adhesion improving agent is dissolved in, for example, an electroless nickel plating bath to form an anti-corrosive coat on the surface of a conductor, e.g., copper, so that electroless nickel plating is unlikely to be deposited. Further, the anti-corrosive coat formed from the adhesion improving agent on the conductor surface is difficult to be removed by a pretreatment of the electroless plating, and hence merely an improvement of the pretreatment of the electroless plating is difficult to solve this problem. However, such a treatment for the conductor surface is important in protection of the conductor surface from corrosion after it is partially subjected to electroless Ni/Au plating and the plating resist is stripped. For this reason, it is preferred that the adhesion improving agent is not added to the layer of the photosensitive resin composition but the surface is treated utilizing, e.g., a technique of organic solderability preservative (OSP). After the plating resist is stripped, marked corrosion is observed in the portion which had been protected by the plating resist when this portion is electrically connected to the conductive portion partially electroless Ni/Au-plated, and the corrosion is considered to be caused by the potential difference between copper and gold. The corrosion portion has poor solderability and hence disadvantageously causes the connection reliability of solder to be lowered.

The photosensitive element used in the present invention can be obtained by, for example, applying photosensitive resin composition (A) onto, as a support, a polymer film of polyethylene terephthalate, polypropylene, polyethylene, or polyester, and drying the composition applied. The application method can be conducted in accordance with a known method using a roll coater, a comma coater, a gravure coater, an air-knife coater, a die coater, or a bar coater. The drying can be made at about 70 to 150° C. for about 5 to 30 minutes. From the viewpoint of preventing the organic solvent from diffusing in the subsequent step, it is preferred that the residual organic solvent content of the (A) layer after the drying is 2% by weight or less. The thickness of the above-mentioned polymer film is preferably 1 to 100 μm.

As for the protective film for the photosensitive element of the present invention, the similar film as the support can be used. A preferred protective film is such that the adhesive force between the layer of photosensitive resin composition (A) and the protective film is smaller than the adhesive force between the (A) layer and the support, and a film having low fish-eye is preferred. Using one type of a polymer film as a support for the (A) layer and different one as a protective film for the (A) layer, the photosensitive element can be formed by laminating the polymer films on both surfaces of the (A) layer. In addition to the (A) layer, support, and protective film, the photosensitive element can have an intermediate layer or a protectivelayer, such as a cushioning layer, an adhesive layer, a light absorption layer, or a gas barrier layer.

The photosensitive element of the present invention can be stored either in the form of a plane plate as such or in the form of a roll formed by, for example, laminating a protective film on one surface (unprotected, exposed surface) of the layer of photosensitive resin composition (A) and winding it round a core tube in, e.g., a cylinder form. It is preferred that the layer is wound so that the support is located on the outermost side during the storage. For protecting the edge face of the photosensitive element roll in a roll form, it is preferred that an edge face separator is provided, and, in addition, from the viewpoint of achieving resistance to edge fusion, it is more preferred that a moisture proof edge face separator is provided. A preferred packing method is such that the element is wrapped in a black sheet having low moisture permeability.

With respect to the core tube, there is no particular limitation. Examples include, for example, plastics, such as polyethylene resins, polypropylene resins, polystyrene resins, polyvinyl chloride resins, and ABS resins (acrylonitrile-butadiene-styrene copolymers).

When a resist pattern of the layer of photosensitive resin composition (A) is produced using the photosensitive element of the present invention, in the photosensitive element which has a support and a protective film, the protective film is removed from the photosensitive element and then used. For example, there can be mentioned a method in which the (A) layer is pressed and laminated onto a wiring board, where a solder resist was formed, while heating to about 70 to 130° C. at a pressure of about 0.1 to 1 MPa (about 1 to 10 kgf/cm$^2$), and it is preferred that the lamination is made under a reduced pressure. The surface onto which the layer is laminated is generally the solder resist surface, but there is no particular limitation.

Thus, the layer of photosensitive resin composition (A) laminated on the wiring board having a circuit and a solder resist formed thereon is exposed to active light ray radiation through a negative or positive mask pattern. As a light source of the above-mentioned active light ray, a known light source, for example, one which effectively radiates an ultraviolet light or visible light, such as a carbon arc lamp, a mercury vapor arc lamp, a high-pressure mercury lamp, or a xenon lamp, can be used. A laser direct imaging exposure method can be employed.

Further, in the present invention, the exposure is conducted using, for example, an exposure machine having a high-pressure mercury lamp (HMW-590; manufactured by ORC Manufacturing Co., Ltd.) at the amount of energy such that the step number of Stouffer 21 step tablet (density range: 0.05 to 3.05; density step: 0.15; size of step tablet: 20 mm×175 mm; size of each step: 5 mm×14 mm) is 8 (density: 1.10). This is the amount of energy such that the area of the residual resist on the substrate corresponding to 8 step (density: 1.10) is 90% or more (based on 5 mm×14 mm) when the layer of the photosensitive resin composition laminated on a copper-clad laminate is irradiated with active light rays (whole wavelengths or the high-pressure mercury lamp) at E (mJ/cm$^2$) through the 21 step tablet and the entire surface of the layer is sprayed with a 1% by weight aqueous solution of sodium carbonate at a pressure of 0.15 MPa (for a period of time twice a minimum development time) wherein the minimum development time is a period of time required for removing the layer of the photosensitive resin composition laminated on another copper-clad laminate when the entire surface of the layer of the photosensitive resin composition is sprayed with a 1% by weight aqueous solution of sodium carbonate at a pressure of 0.15 MPa.

Then, after the exposure, when the support adheres to the layer of photosensitive resin composition (A), the support is removed by an auto-peeler or the like, followed by wet development using a developer, such as an alkaline aqueous solution, an aqueous developer, or an organic solvent and the like, or dry development and the like, thus preparing a desired resist pattern of the (A) layer. As for the alkaline aqueous solutions include, for example, dilute solutions, such as 0.1 to 5% by weight sodium carbonate, 0.1 to 5% by weight potassium carbonate, and 0.1 to 5% by weight sodium hydroxide. The alkaline aqueous solution preferably has pH of 9 to 11, and its temperature is adjusted depending on the developing properties of the (A) layer. Further, a surfactant, a defoamer, or an organic solvent and the like can be added to the alkaline aqueous solution. As examples of development manners, there can be mentioned a dipping manner, a spraying manner, brushing, and slapping and the like.

As a treatment after the development, postcuring can be optionally conducted. For example, a desired resist pattern of the layer of the photosensitive resin composition may be further cured (postcured) by heating the resist pattern to about 60 to 250° C., or further subjecting the resist pattern to exposure at about 0.2 to 10 J/cm$^2$.

As examples of plating after the development for metal terminal portions and the like using the developed resist pattern of the photosensitive resin composition layer as a mask, there can be mentioned electroless nickel plating and replacement electroless plating on the electroless nickel plating. As for the replacement plating include, for example, plating containing at least one metal selected from the group consisting of gold, silver, palladium, platinum, rhodium, copper, and tin. The replacement electroless plating uses a plating solution containing ions of the above-mentioned metal, and a difference in ionization tendency between the metal and nickel previously plated causes nickel to dissolve, so that the above-mentioned metal is deposited. The electroless plating containing at least one metal selected from the above-mentioned metals may contain a reducing agent in the plating solution, and there can be used electroless plating comprising both the replacement reaction between nickel and ions of at least one metal selected from the above-mentioned metals and deposition caused by a reduction reaction of the ions of at least one metal selected from the above-mentioned metals. For example, in the metal plating processing using the developed resist pattern of the layer of the photosensitive resin composition as a mask after the development, the metal terminal portions are subjected to plating pretreatment, such as degreasing treatment, soft etching, acid cleaning treatment, and activation, and subjected to electroless nickel plating, and subsequently subjected to electroless gold plating to form electroless Ni/Au plating.

Then, the resist pattern of the layer of photosensitive resin composition (A) as a plating resist can be stripped by, for example, an alkaline aqueous solution stronger than the alkaline aqueous solution used in the development. As for the above-mentioned strong alkaline aqueous solution, for example, a 1 to 10% by weight aqueous solution of sodium hydroxide, or a 1 to 10% by weight aqueous solution of potassium hydroxide is used. As for the stripping methods include, for example a dipping method and a spraying method and the like. From the viewpoint of obtaining a printed wiring board having excellent electrical properties, it is preferred that the photosensitive resin composition of the present invention is stripped after the electroless plating.

Further, the wiring board having a circuit and having formed a resist pattern of (A) may be a multilayer printed wiring board, and can have small-diameter through holes.

Generally, with respect to the cured product of a resin composition, in a viscoelasticity temperature dispersion curve showing the relationship between the temperature, storage modulus E', loss modulus E", and loss tangent tan δ of the cured product, the relationship between storage modulus E' and loss modulus E" is represented by the following formula:

$$E''/E' = \tan \delta.$$

Here, in ideal elastic body, δ=0, and, in pure viscous fluid, δ=π/2.

Under the conditions below, the crosslinking density of the cured product is represented by the following formula:

$$(\text{Crosslinking density}) = \frac{(\text{Storage modulus } E' \text{ at tan}\delta \text{ peak temperature} + 40°\text{ C.})}{3 \times (\text{Gas constant}) \times (\text{Absolute temperature})}$$

In addition, the modulus of the cured product is represented by the following formula:

$$|E''| = \frac{(\text{Dynamic stress}) \times 9{,}806 \times (\text{Sample length})}{(\text{Dynamic strain}) \times (\text{Sample width}) \times (\text{Sample thickness})}$$

storage modulus $E' = |E^*| \cdot \cos \delta$ loss modulus $E' = |E^*| \cdot \sin \delta$ and $$\tan\delta = \frac{E''}{E'}$$

Units:
crosslinking density: (mol/m$^3$); sample width, sample thickness, sample length: (mm); dynamic stress: (gf); dynamic strain: (mm); phase difference: δ (deg); storage modulus E': (Pa); loss modulus E": (Pa); |E*|: (Pa); 1 gf/mm$^2$: 9,806 Pa; (gas constant): 8.31441 JK$^{-1}$ mol$^{-1}$; (absolute temperature): (K).

From the viewpoint of achieving excellent resistance to a plating solution, the cured product of photosensitive resin composition (A) in the present invention by photocuring and/or thermosetting preferably has a storage modulus E' value in the above-mentioned viscoelasticity temperature dispersion curve of $2.0×10^6$ Pa (N/m$^2$) or more, more prererably $2.5×10^6$ Pa (N/m$^2$) or more, at a temperature 30 to 50° C. higher than a loss tangent tan δ peak temperature (glass transition temperature). Further, the storage modulus E' value at a temperature 30 to 50° C. higher than a loss tangent tan δ peak temperature (glass transition temperature) is preferably $2.0×10^6$ to $8.0×10^6$ Pa (N/m$^2$), more preferably $2.5×10^6$ to $6.0×10^6$ Pa (N/m$^2$). The storage modulus E' value at a temperature 40° C. higher than a loss tangent tan δ peak temperature (glass transition temperature) is preferably $2.0×10^6$ Pa (N/m$^2$) or more, ore preferably $2.5×10^6$ Pa (N/m$^2$) or more.

From the viewpoint of achieving excellent resistance to a developer and a plating solution, the cured product of photosensitive resin composition (A) of the present invention preferably has the ratio of water absorption of 8% or less, more preferably 6% or less, especially preferably 5% or less, extremely preferably 4% or less.

From the viewpoint of preventing the cured film from suffering breakage during the plating, the cured product of photosensitive resin composition (A) of the present invention preferably has break strain of 50% or more, more preferably 70% or more, especially preferably 80% or more, extremely preferably 90% or more,

EXAMPLES

Hereinbelow, the present invention will be described in more detail with reference to the following Examples of the present invention and Comparative Examples, which should not be construed as limiting the scope of the present invention.

Synthesis of Binder Polymer 700 g of a mixed solvent of ethylene glycol monomethyl ether and toluene in a 3:2 weight ratio (hereinafter, referred to as "solution A") was added to a flask equipped with a stirrer, a reflux condenser, a thermometer, a dropping funnel, and a nitrogen gas feeding pipe, and stirred and heated to 85° C. while feeding nitrogen gas. A mixture obtained by preliminarily mixing together 110 g of methacrylic acid, 225 g of methyl methacrylate, 135 g of ethyl acrylate, 30 g of styrene, and 3 g of azobisisobutyronitrile was added dropwise to the solution A at a temperature of 85° C. over 4 hours, and then the resultant mixture was maintained at 85° C. for 2 hours while stirring. Next, 60 g of solution A was weighed and 0.3 g of azobisisobutyronitrile was dissolved in the solution A, and the resultant solution was added dropwise to the above-obtained mixture over 10 minutes. Then, the resultant solution was maintained at 85° C. for 5 hours while stirring, and then cooled to obtain a polymer. The polymer obtained had a nonvolatile content of 41.8% by weight and a weight average molecular weight of 84,000.

The weight average molecular weight is a value measured by a gel permeation chromatography method and determined using a calibration curve obtained from standard polystyrene.

Materials for Photosensitive Resin Composition

The compounds shown below were used in Examples.

2,2-Bis [4-(methacryloxypentaethoxy)phenyl]propane (BPE-500; manufactured by Shin-Nakamura Chemical Co., Ltd.); molecular weight-804.

2,2-Bis[4-(methacryloxypentadecaethoxy)phenyl]propane (BPE-1300; manufactured by Shin-Nakamura Chemical Co., Ltd.); molecular weight: 1,684.

EO,PO-Modified urethane dimethacrylate (UA-13; manufactured by Shin-Nakamura Chemical Co., Ltd.); molecular weight: 1,436.

EO-modified trimethylolpropane triacrylate (TA-401; manufactured by Sanyo Chemical Industries, Ltd.); molecular weight: 428.

Polypropylene glycol diacrylate (AFG-400; manufactured by Shin-Nakamura Chemical Co., Ltd.)(number of propylene glycol chains: 7); molecular weight: 532.

Polyethylene glycol dimethacrylate (4G; manufactured by Shin-Nakamura Chemical Co, Ltd.)(number of ethylene glycol chains: 4); molecular weight: 330.

Polyethylene glycol dimethacrylate (14G; manufactured by Shin-Nakamura Chemical Co., Ltd.)(number of ethylene glycol chains: 14); molecular weight: 770.

Polyethylene glycol diacrylate (A-600; manufactured by Shin-Nakamura Chemical Co., Ltd.)(number of ethylene glycol chains: 14); molecular weight: 742.

Example 1

(a) A solution of the photosensitive resin composition of the present invention having the formulation of materials shown in Table 1 was obtained.

(b) The solution of the photosensitive resin composition obtained in the previous step was coated onto a polyethylene terephthalate film (hereinafter, referred to as "PET") having a (width: 380 mm×thickness: 20 μm) size so that the dried film had a thickness of 50 μm. The resultant film was dried at 100° C. using a hot-air convection dryer, and a polyethylene film having a thickness of 35 μm was placed on the dried film, followed by press-coating by means of rolls, to obtain a photosensitive element in the present invention.

Examples 2 to 12

Photosensitive elements in the present invention were individually obtained in accordance with substantially the same procedure an in Example 1 except that the formulation of ingredients was changed to those shown in Table 1.

The formulations of the photosensitive resin compositions in Examples 1 to 12 are shown in Table 1. In the Table, the unit is part(s) by weight. The weight of the binder polymer is shown in terms of a nonvolatile content.

TABLE 1

| | Example 1 | Example 2 | Example 3 | Example 4 | Example 5 | Example 6 | Example 7 | Example 8 | Example 9 | Example 10 | Example 11 | Example 12 |
| --- | --- | --- | --- | --- | --- | --- | --- | --- | --- | --- | --- | --- |
| Binder polymer | 60 | 60 | 60 | 60 | 60 | 60 | 60 | 60 | 60 | 60 | 60 | 60 |
| Bisphenol A polyoxyethylene dimethacrylate (BPE-500) | — | — | — | — | — | 20 | — | — | — | 20 | — | — |
| Bisphenol A polyoxyethylene dimethacrylate (BPE-1300) | — | — | — | — | 40 | 20 | 30 | 20 | 40 | 20 | 30 | 20 |

TABLE 1-continued

| | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| EO,PO-modified urethane dimethacrylate (UA-13) | — | — | — | — | — | — | 10 | — | — | — | 10 | — |
| EO-modified trimethylolpropane triacrylate (TA-401) | — | — | — | — | — | — | — | 10 | — | — | — | 10 |
| Polypropylene glycol diacrylate (APG-400) | — | — | 20 | 10 | — | — | — | 10 | — | — | — | 10 |
| Polyethylene glycol dimethacrylate (4G) | 40 | — | 20 | — | — | — | — | — | — | — | — | — |
| Polyethylene glycol dimethacrylate (14G) | — | 40 | — | 20 | — | — | — | — | — | — | — | — |
| Polyethylene glycol diacrylate (A-600) | — | — | — | 10 | — | — | — | — | — | — | — | — |
| 2-(o-Chlorophenyl)-4,5-diphenylimidazole dimer | 3.0 | 3.0 | 3.0 | 3.0 | 3.0 | 3.0 | 3.0 | 3.0 | 3.0 | 3.0 | 3.0 | 3.0 |
| Diethylaminobenzophenone | 0.1 | 0.1 | 0.1 | 0.1 | 0.1 | 0.1 | 0.1 | 0.1 | 0.1 | 0.1 | 0.1 | 0.1 |
| Leuco crystal violet | 0.5 | 0.5 | 0.5 | 0.5 | 0.5 | 0.5 | 0.5 | 0.5 | 0.5 | 0.5 | 0.5 | 0.5 |
| p-Toluenesulfonamide | 4.0 | 4.0 | 4.0 | 4.0 | 4.0 | 4.0 | 4.0 | 4.0 | 4.0 | 4.0 | 4.0 | 4.0 |
| Malachite green | 0.03 | 0.03 | 0.03 | 0.03 | 0.03 | 0.03 | 0.03 | 0.03 | 0.03 | 0.03 | 0.03 | 0.03 |
| Acetone | 15 | 15 | 15 | 15 | 15 | 15 | 15 | 15 | 15 | 15 | 15 | 15 |
| Toluene | 10 | 10 | 10 | 10 | 10 | 10 | 10 | 10 | 10 | 10 | 10 | 10 |

Note: The unit in the Table is part(s) by weight.

Properties Evaluation Test

Preparation of Properties Evaluation Sample

Examples 1 to 8

An etching resist was formed on the surface of a copper foil of a copper-clad epoxy laminate (MCL-E-67; manufactured by Hitachi Chemical Co., Ltd.) having a size of width: 12.5 cm×length: 20 cm×thickness. 1.6 mm, and an unnecessary copper foil was etched away, and metal terminals (pads) and a circuit for wiring were formed and then, the residual etching resist was stripped to obtain a wiring board having a circuit.

A photoresist (PSR-4000; manufactured by TAIYO INK MFG. CO., LTD) was coated to the entire surface of the obtained wiring board having a circuit, and then dried at 80° C. for 30 minutes. Then, excluding the pad portions, the entire surface was exposed through a mask pattern (phototool) using an exposure machine (HMW-590; manufactured by ORC Manufacturing Co., Ltd.). The unexposed portions (pad portions) were subjected to spray development using a 1% by weight aqueous solution of sodium carbonate (30° C.) to remove the photoresist on the pad portions, thus forming a resist pattern for solder resist. Then, the resist pattern was heated to cure at 150° C. for 1 hour and further thermoset to form a solder resist.

The photosensitive elements (photosensitive layers) each having a thickness of 50 μm prepared by the above method in Examples 1 to 8 were individually pressed and laminated onto the substrate having the solder resist formed thereon at a pressure of 0.4 MPa, 100° C., and a lamination speed of 1.5 m/min. Then, excluding the pad portions, the entire surface was exposed and developed in the same manner as that mentioned above to obtain properties evaluation samples 1 to 8 coated with the layer (A layer) of the cured photosensitive resin composition.

Examples 9 to 12

A wiring board having a circuit was obtained in accordance with the same procedure as in Examples 1 to 8. The photosensitive elements (photosensitive layers) each having a thickness of 50 μm in Examples 9 to 12 were individually pressed and laminated onto the obtained wiring board having a circuit at a pressure of 0.4 MPa, 100° C., and a lamination speed of 1.5 m/min. Then, excluding the pad portions, the entire surface was exposed through a mask pattern (phototool) using an exposure machine (HMW-590; manufactured by ORC Manufacturing Co., Ltd.). The unexposed portions (pad portions) were subjected to spray development using a 1% by weight aqueous solution of sodium carbonate (30° C.) to remove the photoresist on the pad portions, thus obtaining properties evaluation samples 9 to 12 coated with the layer (A layer) of the cured photosensitive resin composition. The obtaining properties evaluation samples 9 to 12 were evaluated in the same manner as in Examples 1 to 8 with respect to the plating resistance in (4) and the stripping properties in (5).

Then, a photoresist (PSR-4000; manufactured by TAIYO INK MFG. CO., LTD.) was coated to the entire surface of the electroless Ni/Au-plated wiring board having a circuit, and then dried at 80° C. for 30 minutes. Then, excluding the pad portions, the entire surface was subjected to exposure and development in the same manner as that mentioned above to remove the photoresist on the pad portions, thus forming a resist pattern for solder resist. Then, the resist pattern was heated to cure at 150° C. for 1 hour and further thermoset to form a solder resist.

(1) Measurement Method of Storage Modulus E' of Cured Film of Photosensitive Resin Composition The photosensitive element of the present invention obtained in the Example was subjected to exposure using an exposure machine having a high-pressure mercury lamp (HMW-590; manufactured by ORC Manufacturing Co., Ltd.) at the amount of energy such that the step number of Stouffer 21 step tablet was 8. After the exposure, the PET film and polyethylene film were stripped by hand from the photosensitive element to prepare a sample for evaluation comprised of a cured film of the photosensitive resin composition, having a (width: 5 mm×length: 40 mm×thickness 50 μm unit) size.

The test specimen was held in a viscoelasticity measurement apparatus (SOLIDS ANALYZER RSA-II; manufactured by Rheometrics Inc.) at a distance between chucks of 20 mm. Then, a measurement was conducted at a temperature rise rate of 5° C./min at a measurement frequency of 10 Hz in the measurement temperature range of from −50 to 250° C. to determine loss tangent tan δ peak temperature, and storage modulus E' at a temperature 40° C. higher than the peak temperature was determined. As an example, the viscoelasticity temperature dispersion curves in Example 6 are shown in FIG. 2 {Tg=89° C., $E'_{129°C.}=3.4 \times 10^6$ (Pa)}.

(2) Measurement Method of the Ratio of Water Absorption of Cured Film of Photosensitive Resin Composition The photosensitive element (photosensitive layer) was thermally pressed and laminated onto a stainless steel sheet having a size of width: 10 cm×length: 15 cm×thickness 1 mm at a pressure of 0.4 MPa at a lamination speed of 1.5 m/min while heating to 100° C. to prepare a laminate specimen. Using an exposure machine having a high-pressure mercury lamp (HMW-590; manufactured by ORC Manufacturing Co., Ltd.) and using as a negative phototool having an 8 cm×10 cm window placed on the laminate specimen, it was subjected to exposure at the amount of energy such that the residual step number of Stouffer 21 step tablet after the development was 8. After the exposure, the resultant laminate specimen was allowed to stand at room temperature for 15 minutes, and then the PET film was stripped by hand, and subjected to development by spraying a 1% by weight aqueous solution of sodium carbonate (30° C.) to prepare an 8×10 cm sample for evaluation comprised of a cured film of the photosensitive resin composition.

With respect to the test specimen, the ratio of water absorption was determined in terms of a difference in weight (cured film) between before the test specimen was immersed in pure water and after the test specimen was immersed in pure water for 15 minutes at room temperature.

(3) Measurement Method of Break Strain of Cured Film of Photosensitive Resin Composition The photosensitive element having a 15 mm×100 mm size was subjected to exposure using an exposure machine having a high-pressure mercury lamp (HMW-590; manufactured by ORC Manufacturing Co., Ltd.) at the amount of energy such that the step number of Stouffer 21 step tablet was 8. After the exposure, the PET and polyethylene films were removed from the photosensitive element in the same manner as that mentioned above to prepare a sample for evaluation comprised of a cured film of the photosensitive resin composition, having a (width: 15 mm×length: 100 mm×thickness 50 μm unit) size.

The test specimen was held in Autograph (RT-3010D-CW; manufactured by LEOTEC CO.), which is a tensile testing machine, at a distance between chucks of 50 mm. Then, a vertical tensile test was conducted at a tensile speed of 2 cm/min to determine break strain.

(4) Plating Resistance

With respect to the properties evaluation samples obtained, the following treatments were successively conducted.

(a) Degreasing Treatment

A sample is immersed in Z-200 (trade name; manufactured by World Metal Co., Ltd.) at 50° C. for 1 minute.

(b) Water Cleaning

The sample is washed with running water at room temperature for 2 minutes.

(c) Soft Etching

The sample is immersed in a 100 g/l ammonium persulfate bath at room temperature for 1 minute.

(d) Water Cleaning

The sample is washed with running water at room temperature for 2 minutes.

(e) Acid Cleaning Treatment

The sample is immersed in a 10% sulfuric acid solution at room temperature for 1 minute.

(f) Water Cleaning

The sample is washed with running water at room temperature for 2 minutes.

(g) Activation

The sample is immersed in SA-100 (trade name; manufactured by Hitachi Chemical Co., Ltd.), which is a catalytic solution for electroless plating, at room temperature for 5 minutes.

(h) Water Cleaning

The sample is washed with running water at room temperature for 2 minutes.

(i) Electroless Nickel Plating

The sample is immersed in NIPS-100 (trade name; manufactured by Hitachi Chemical. Co., Ltd.), which is a Ni—P plating (P content: 7%) solution, at 85° C. for 20 minutes.

(j) Water Cleaning

The sample is washed with running water at room temperature for 2 minutes.

(k) Replacement Electroless Gold Plating

The sample is immersed in Aurotek SF (trade name; manufactured by ATOTECH), which is a replacement electroless gold plating solution, at 85° C. for 10 minutes.

(l) Post-Treatment

After completion of the plating, the sample was washed with water, and dried at 85° C. for 15 minutes.

The thus obtained plating-processed sample for properties evaluation was visually examined in respect of breakage in the resist, especially at the periphery of a pad portion.

(5) Stripping Properties

The properties evaluation sample obtained was immersed in a 3% aqueous solution of sodium hydroxide preliminarily heated to 50° C. A period of time until the cured photosensitive resin composition was stripped from the solder resist surface, and a size of the stripped piece were measured.

The properties values of the photosensitive resin compositions and the cured films obtained from the compositions in Examples 1 to 8 are shown in Table 2, and the properties values of those in Examples 9 to 12 are shown in Table 3. The properties values include a total molar number ΣM of reactive groups in the photopolymerizable compound having in the molecule thereof a polymerizable, unsaturated ethylene group, per 1 kg of a solid component of the photosensitive resin composition, storage modulus E' of the cured film at a temperature 40° C. higher than loss tangent tan δ peak temperature (glass transition temperature) in a viscoelasticity temperature dispersion curve, the ratio of water absorption, break strain, plating resistance, and stripping properties.

TABLE 2

|  | Example 1 | Example 2 | Example 3 | Example 4 | Example 5 | Example 6 | Example 7 | Example 8 |
|---|---|---|---|---|---|---|---|---|
| Total mole of reactive groups in photopolymerizable compound: ΣM (mol) | 2.25 | 0.97 | 1.82 | 1.08 | 0.44 | 0.68 | 0.46 | 1.22 |
| (1) Storage modulus: E* (Pa) | $1.3 \times 10^6$ | $1.8 \times 10^6$ | $1.3 \times 10^6$ | $1.5 \times 10^6$ | $5.0 \times 10^6$ | $3.4 \times 10^6$ | $4.5 \times 10^6$ | $4.0 \times 10^6$ |
| (2) The ratio of water absorption (%) | 5 | 4 | 5 | 4 | 4 | 3 | 4 | 3 |
| (3) Break strain (%) | 40 | 100 | 30 | 90 | 145 | 120 | 140 | 95 |
| (4) Plating resistance | Breakage observed | Breakage observed | Breakage observed | Breakage observed | No breakage | No breakage | No breakage | No breakage |
| (5) Strip properties  Strip time (sec) | 160 | 220 | 160 | 200 | 90 | 95 | 80 | 90 |
| Stripped piece (mm square) | 10 | 20 | 10 | 20 | 10 | 20 | 10 | 20 |

TABLE 3

|  | Example 9 | Example 10 | Example 11 | Example 12 |
|---|---|---|---|---|
| Total mole of reactive groups in photopolymerizable compound: ΣM (mol) | 0.44 | 0.68 | 0.46 | 1.22 |
| (1) Storage modulus: E' (Pa) | $5.0 \times 10^6$ | $3.4 \times 10^6$ | $4.6 \times 10^6$ | $4.0 \times 10^6$ |
| (2) The ratio of water absorption (%) | 4 | 3 | 4 | 3 |
| (3) Break strain (%) | 145 | 120 | 140 | 95 |
| (4) Plating resistance | No breakage | No breakage | No breakage | No breakage |
| (5) Strip properties  Strip time (sec) | Partially unstripped/Bad | Partially unstripped/Bad | Partially unstripped/Bad | Partially unstripped/Bad |
| Stripped piece (mm square) |  |  |  |  |

As is apparent from Table 2, in the wiring boards of the properties evaluation samples in Examples 1 to 8 prepared by the process of the present invention, the mount pad portions requiring no plating processing were not electroless-plated, and hence the connection reliability of mount parts was excellent.

Especially in Examples 4 to 8 in which the photosensitive resin composition of the present invention was used in the process of the present invention, the total molar number ΣM of reactive groups in the photopolymerizable compound is 0.3 to 1.5 mol, and when storage modulus E' of the cured film at a temperature 40° C. higher than loss tangent tan δ peak temperature (glass transition temperature) is $2.0 \times 10^6$ Pa (N/m²) or more, the cured films had the ratio of water absorption of 8% or less, a break strain of 50% or more, and excellent plating resistance, and further the cured films were found to have excellent stripping properties such that they could be stripped in a strip time as short as 100 seconds or less and the stripped pieces had sizes as small as 30 mm or less, and thus they exhibited excellent adaptability.

From Examples 9 to 12, the following two findings are obtained. The first one is findings of comparative examples of the process of the present invention. When the order of the steps in the process of the present invention was changed, light leakage occurred in the exposure for the layer of the photosensitive resin composition. Therefore, in stripping of the cured films, each cured film remained unstripped partially and hence it was not easy to remove the used resist pattern.

The other one is findings of the performance of the photosensitive resin composition of the present invention. The photosensitive resin composition of the present invention had excellent plating resistance. There are samples having stripping properties such that an unstripped film remains, and the cause of this is excess exposure due to light leakage and hence irrelevant to the essential performance of the composition of the present invention.

Further, when properties evaluation samples were prepared in substantially the same manner as in properties evaluation samples 1 to 8 except that lamination of the photosensitive element was conducted in vacuum, the samples laminated in vacuum were improved in imbedding properties in the unevenness of the laminate surface, as compared to those laminated under atmospheric pressure. In the evaluation of plating resistance, with respect to properties evaluation samples 1 to 4, breakage was observed similarly, but the number of breakage was reduced. With respect to properties evaluation samples 5 to 8, no breakage was observed similarly, and further there was no sample which merely blistered without suffering breakage, and thus the plating resistance was improved.

Further, when properties evaluation samples were prepared in substantially the same manner as in properties evaluation samples 1 to 8 except that the thickness of the layer of photosensitive resin composition (A) was changed to 20 μm, all the samples having a thickness of 20 μm had poor plating resistance such that breakage was observed in the evaluation of plating resistance, as compared to the samples having a thickness of 50 μm.

INDUSTRIAL APPLICABILITY

The process for producing a printed wiring board of the present invention is a process for producing a printed wiring board, which is advantageous not only in that surface mount of electronic parts for achieving a reduction in size and an increase in density of the wiring board is realized using novel step procedures for the process and further the steps are simplified, but also in that the connection reliability of mount parts and the yield are improved. By using the photosensitive resin composition found in the present invention in the process of the present invention, more excellent effects can be obtained.

The photosensitive resin composition of the present invention exhibits performance as an excellent protective film in electroless plating.

The layer of the photosensitive resin composition for electroless plating resist, which is used in the production of printed wiring board of the present invention, and which is laminated on the solder resist formed on a wiring board having a circuit and patterned, has excellent plating resistance and excellent stripping properties, and hence it improves the connection reliability of mount parts and the yield.

The invention claimed is:

1. A process for producing a printed wiring board, the process comprising the steps of:
    (i) forming a solder resist to expose a region for a mount pad on a wiring board having a circuit;
    (ii) laminating a preliminarily molded layer of a photosensitive resin composition on the solder resist;
    (iii) subjecting the layer of the photosensitive resin composition to exposure and development to form a resist pattern of the photosensitive resin composition and to expose a region to be subjected to electroless plating, wherein the region to be subjected to electroless plating comprises only a part of the region for the mount pad;
    (iv) subjecting the entire surface of the resultant board to electroless plating; and
    (v) stripping the layer of the photosensitive resin composition, wherein the steps are conducted in this order.

2. The process according to claim 1, wherein, after the step (iii), the resist pattern is postcured.

3. The process according to claim 2, wherein the electroless plating in the step (iv) comprises electroless Ni/Au plating.

4. The process according to claim 2, wherein a total molar number $\Sigma M$ of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} MiNi \qquad (I)$$

where $\Sigma M$ is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number $\Sigma M$ of the reactive groups in the photopolymerizable compound having in the molecule thereof a polymerizable, unsaturated ethylene group contained in the photosensitive resin composition is 0.3 to 1.5 mol per 1 kg of a solid component of the photosensitive resin composition.

5. The process according to claim 2, wherein the photosensitive resin composition comprises at least one compound selected from the group consisting of bisphenol A polyoxyethylene dimethacrylate, ethylene oxide, polypropylene oxide-modified urethane dimethacrylate, and ethylene oxide-modified trimethylolpropane triacrylate.

6. The process according to claim 2, wherein the photosensitive resin composition forms a cured product having a storage modulus E' value of $2.0 \times 10^6$ Pa (N/m$^2$) or more at a temperature 30 to 50° C. higher than a glass transition temperature of the cured product of the photosensitive resin composition.

7. The process according to claim 2, wherein the photosensitive resin composition forms a cured product having the ratio of water absorption of 8% or less.

8. The process according to claim 2, wherein the photosensitive resin composition forms a cured product having break strain of 50% or more.

9. The process according to claim 1, wherein the electroless plating in the step (iv) comprises electroless Ni/Au plating.

10. The process according to claim 9, wherein a total molar number $\Sigma M$ of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} MiNi \qquad (I)$$

where $\Sigma M$ is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number $\Sigma M$ of the reactive groups in the photopolymerizable compound having in the molecule thereof a polymerizable, unsaturated ethylene group contained in the photosensitive resin composition is 0.3 to 1.5 mol per 1 kg of a solid component of the photosensitive resin composition.

11. The process according to claim 9, wherein the photosensitive resin composition comprises at least one compound selected from the group consisting of bisphenol A polyoxyethylene dimethacrylate, ethylene oxide, polypropylene oxide-modified urethane dimethacrylate, and ethylene oxide-modified trimethylolpropane triacrylate.

12. The process according to claim 9, wherein the photosensitive resin composition forms a cured product having a storage modulus E' value of $2.0 \times 10^6$ Pa (N/m$^2$) or more at a temperature 30 to 50° C. higher than a glass transition temperature of the cured product of the photosensitive resin composition.

13. The process according to claim 9, wherein the photosensitive resin composition forms a cured product having the ratio of water absorption of 8% or less.

14. The process according to claim 9, wherein the photosensitive resin composition forms a cured product having break strain of 50% or more.

15. The process according to claim 1, wherein a total molar number $\Sigma M$ of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} MiNi \qquad (I)$$

where ΣM is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number ΣM of the reactive groups in the photopolymerizable compound having in the molecule thereof a polymerizable, unsaturated ethylene group contained in the photosensitive resin composition is 0.3 to 1.5 mol per 1 kg of a solid component of the photosensitive resin composition.

16. The process according to claim 15, wherein the photosensitive resin composition comprises at least one compound selected from the group consisting of bisphenol A polyoxyethylene dimethacrylate, ethylene oxide, polypropylene oxide-modified urethane dimethacrylate, and ethylene oxide-modified trimethyloipropane triacrylate.

17. The process according to claim 15, wherein the photosensitive resin composition forms a cured product having a storage modulus E' value of $2.0 \times 10^6$ Pa (N/m²) or more at a temperature 30 to 50° C. higher than a glass transition temperature of the cured product of the photosensitive resin composition.

18. The process according to claim 15, wherein the photosensitive resin composition forms a cured product having the ratio of water absorption of 8% or less.

19. The process according to claim 15, wherein the photosensitive resin composition forms a cured product having break strain of 50% or more.

20. The process according to claim 1, wherein the photosensitive resin composition comprises at least one compound selected from the group consisting of bisphenol A polyoxyethylene dimethacrylate, ethylene oxide, polypropylene oxide-modified urethane dimethacrylate, and ethylene oxide-modified trimethylolpropane triacrylate.

21. The process according to claim 20, wherein the photosensitive resin composition forms a cured product having a storage modulus E' value of $2.0 \times 10^6$ Pa (N/m²) or more at a temperature 30 to 50° C. higher than a glass transition temperature of the cured product of the photosensitive resin composition.

22. The process according to claim 20, wherein the photosensitive resin composition forms a cured product having the ratio of water absorption of 8% or less.

23. The process according to claim 20, wherein the photosensitive resin composition forms a cured product having break strain of 50% or more.

24. The process according to claim 1, wherein the photosensitive resin composition forms a cured product having a storage modulus E' value of $2.0 \times 10^6$ Pa (N/m²) or more at a temperature 30 to 50° C. higher than a glass transition temperature of the cured product of the photosensitive resin composition.

25. The process according to claim 24, wherein the photosensitive resin composition forms a cured product having the ratio of water absorption of 8% or less.

26. The process according to claim 24, wherein the photosensitive resin composition forms a cured product having break strain of 50% or more.

27. The process according to claim 1, wherein the photosensitive resin composition forms a cured product having the ratio of water absorption of 8% or less.

28. The process according to claim 27, wherein the photosensitive resin composition forms a cured product having break strain of 50% or more.

29. The process according to claim 1, wherein the photosensitive resin composition forms a cured product having break strain of 50% or more.

30. A photosensitive resin composition for use in printed wiring board production as a plating resist for two or more different types of electroless plating, comprising a binder polymer, having a carboxyl group, having a weight average molecular weight of 20,000 to 300,000, wherein a total molar number ΣM of the reactive groups in a photopolymerizable compound having in the molecule thereof a polymerizable, unsaturated ethylene group contained in the photosensitive resin composition is represented by the following formula (I):

$$\Sigma M = \sum_{i=1}^{k} MiNi \qquad (I)$$

where ΣM is the total molar number of the reactive groups per 1 kg of a solid component of the photosensitive resin composition; Mi is the molar number in a photopolymerizable compound i per 1 kg of a solid component of the photosensitive resin composition; Ni is the number of the reactive groups in the photopolymerizable compound i; and k is a total number of the photopolymerizable compound in the composition, wherein the total molar number ΣM of reactive groups in the photopolymerizable compound having in the molecule thereof a polymerizable, unsaturated ethylene group contained in the photosensitive resin composition is 0.3 to 1.5 mol per 1 kg of a solid component of the photosensitive resin composition, wherein a storage modulus E' value for the cured product of the photosensitive resin composition is $2.0 \times 10^6$ Pa (N/m²) or more at a temperature 30 to 50° C. higher than a glass transition temperature of the cured product of the photosensitive resin composition.

31. The photosensitive resin composition according to claim 30, which comprises at least one compound selected from the group consisting of bisphenol A polyoxyethylene dimethacrylate, ethylene oxide, polypropylene oxide-modified urethane dimethacrylate, and ethylene oxide-modified trimethylolpropane triacrylate, and wherein the photosensitive resin composition further comprises a 2,4,5-triarylimidazole dimer.

32. The photosensitive resin composition according to claim 30, which forms a cured product having the ratio of water absorption of 8% or less.

33. The photosensitive resin composition according to claim 30, which forms a cured product having break strain of 50% or more.

* * * * *